United States Patent [19]

Tailliet et al.

[11] Patent Number: 5,003,371
[45] Date of Patent: Mar. 26, 1991

[54] FUSE-MELTING DEVICE

[75] Inventors: Francois Tailliet, Epinay sur Seine; Jacek Kowalski, Trets, both of France

[73] Assignee: SGS-Thomson Microelectronics, Gentilly, France

[21] Appl. No.: 264,205

[22] Filed: Oct. 28, 1988

[30] Foreign Application Priority Data

Nov. 6, 1987 [FR] France ................. 87 15404

[51] Int. Cl.[5] ................. H01L 27/02; H01L 29/06; H01L 27/02
[52] U.S. Cl. ........................ 357/42; 357/23.9; 357/51
[58] Field of Search ............. 357/42, 23.9, 51

[56] References Cited

U.S. PATENT DOCUMENTS 3,955,210  5/1976  Bhatia et al. ............. 357/42
4,079,504  3/1978  Kosa ..................... 357/23.9
4,288,804  9/1981  Kikuchi et al. ........... 357/42

FOREIGN PATENT DOCUMENTS 0059630 of 0000 European Pat. Off. .
0148510 of 0000 .
0084000 of 0000 Japan .
60-160654 of 0000 Japan .
59-105354 6/1984 Japan ................... 357/42
58-56082 10/1984 Japan ................... 357/42

Primary Examiner—Rolf Hille
Assistant Examiner—Wael Fahmy
Attorney, Agent, or Firm—Roland Plottel

[57] ABSTRACT

The melting of a fuse of a CMOS type integrated circuit is caused by using the existence of a stray thyristor created in the neighborhood of the boundaries of pads made in a substrate. This stray thyristor is triggered by artificially making the potential drop in an intermediate region of the pad. The thyristor always comes on suddenly, the current that flows through the thyristor is very high and the phenomenon stops spontaneously when the fuse is melted.

3 Claims, 4 Drawing Sheets

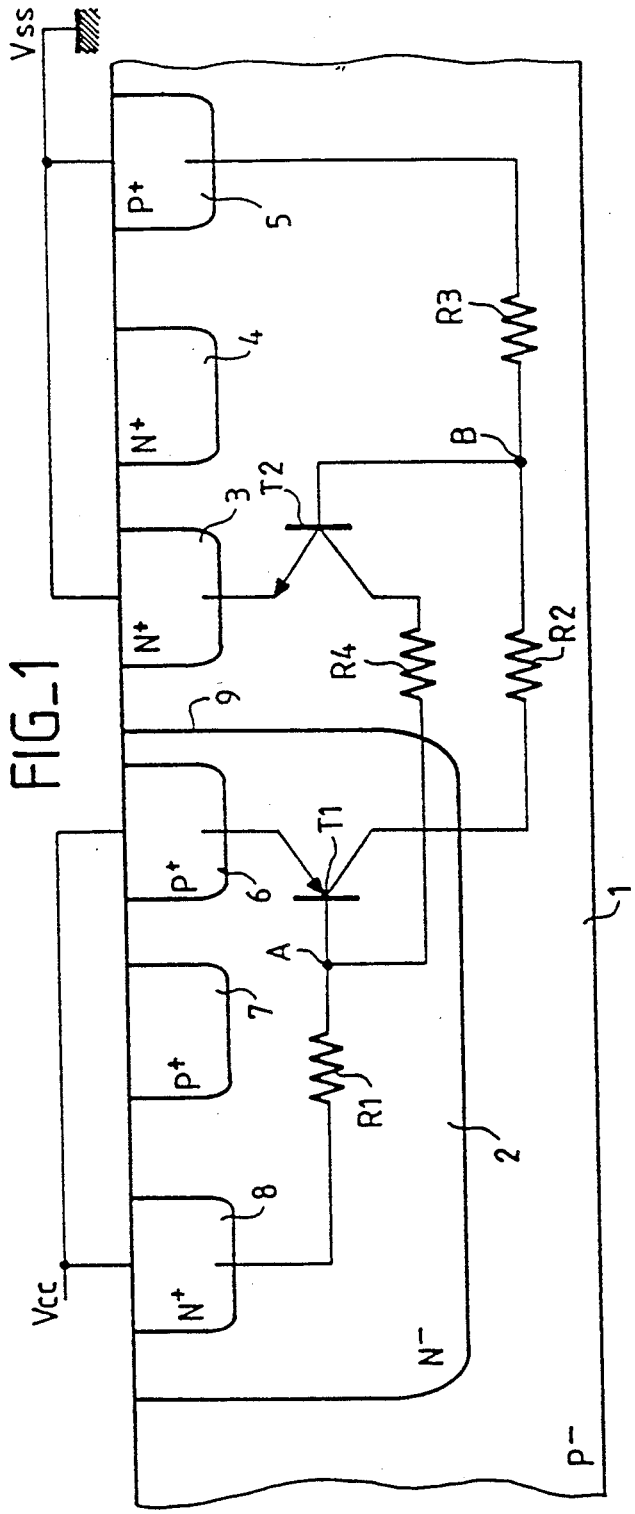
FIG_1
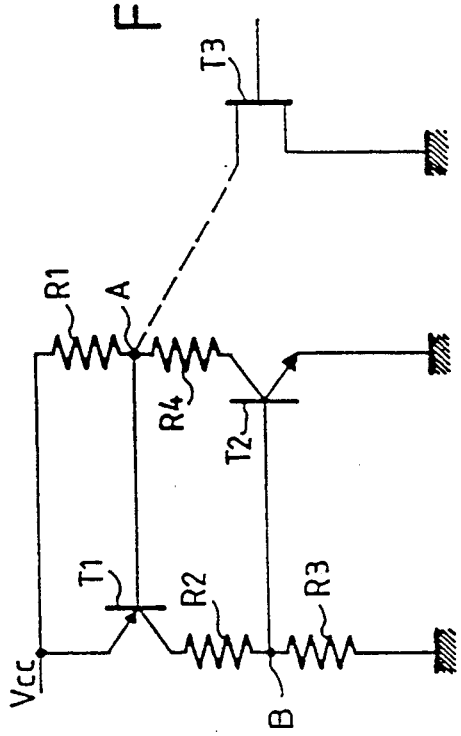
FIG_2

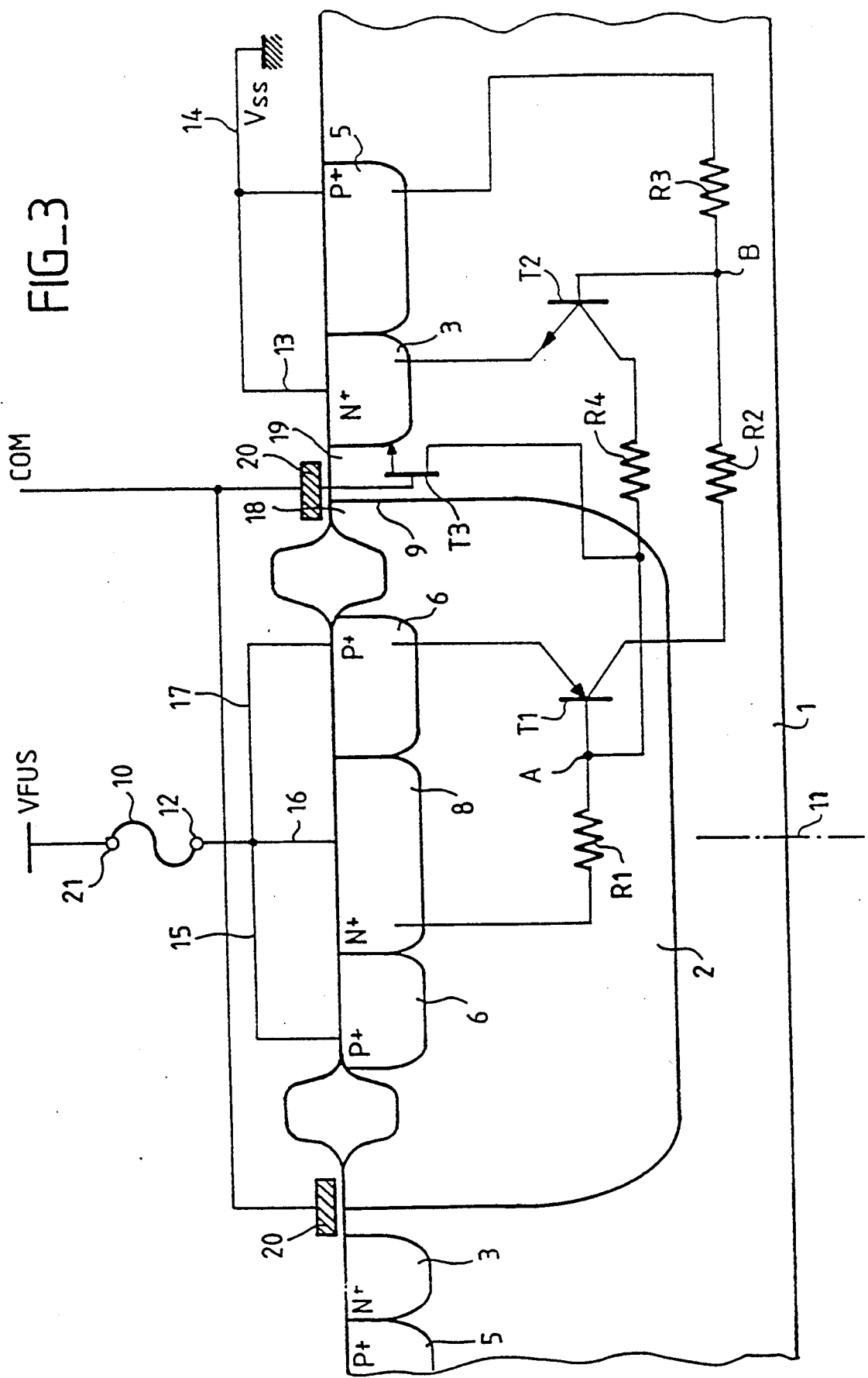
FIG_3

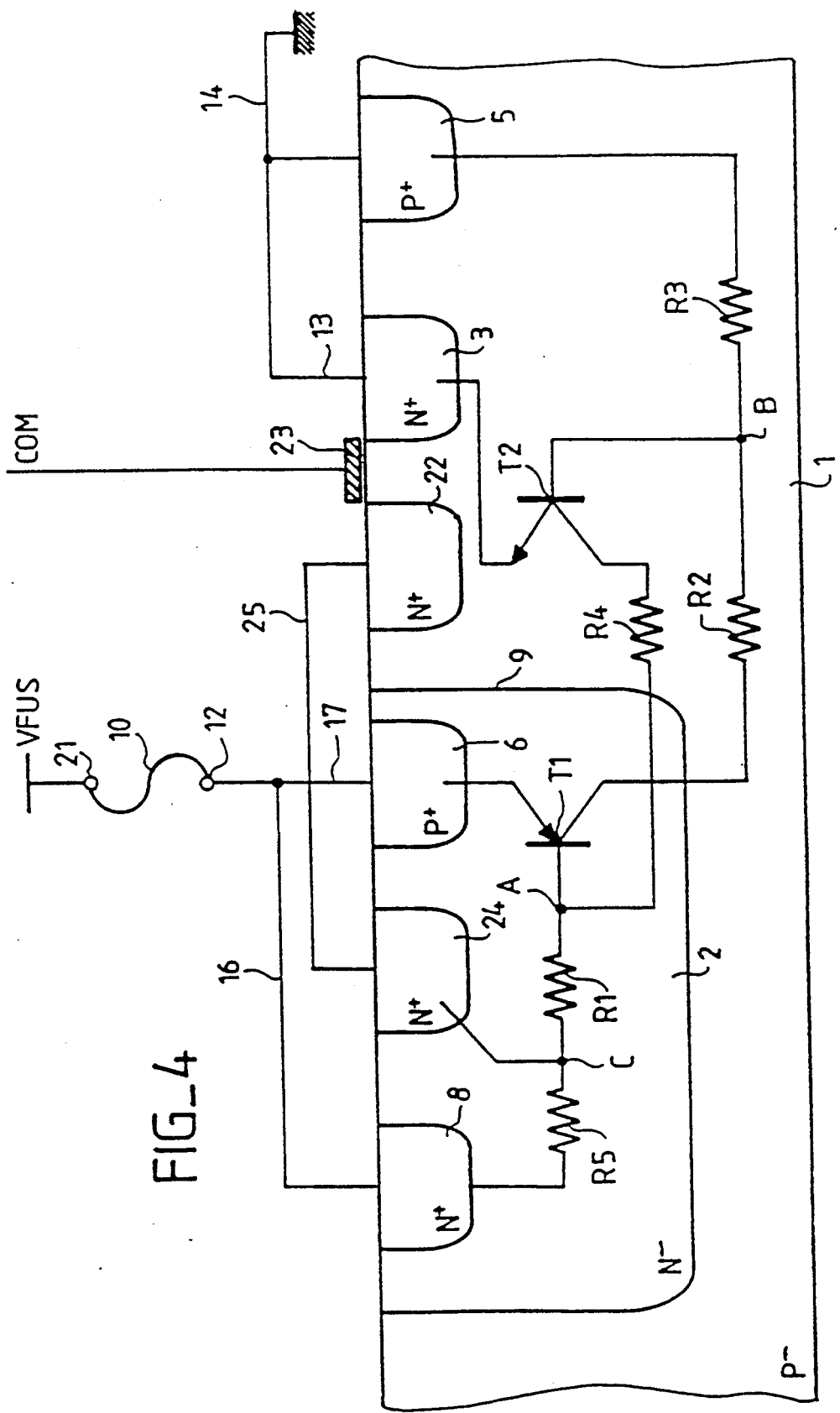
FIG_4

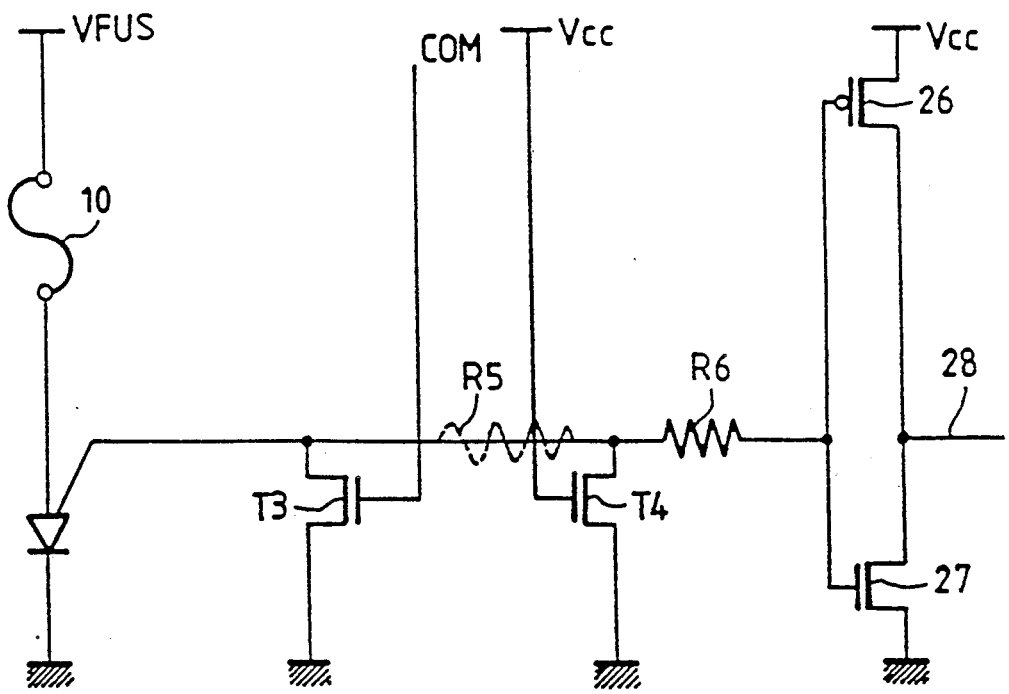
FIG_5
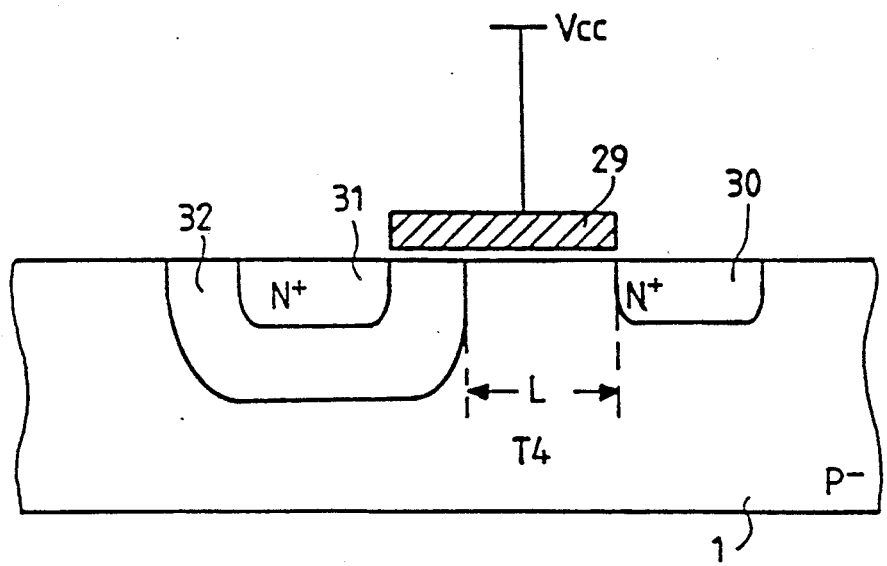
FIG_6

FUSE-MELTING DEVICE

BACKGROUND OF THE INVENTION

1. Field of the Invention

An object of the present invention is a device for the melting of a fuse in a CMOS type integrated circuit. It can be applied in many, varied integrated circuits, in particular, to define read-only memories or to replace functional circuits therein, which have been put out of order, by redundant functional circuits. In memory card applications, fuses can also be used for the protection, in access, of certain memory zones. Before they melt, the connection that they set up enables the integrated circuit of the memory card to be programmed in order to introduce secret codes or recognition algorithms therein. After they melt, this programming as well as the reading of these secret codes or algorithms become impossible.

2. Description of the Prior Art

In an integrated circuit, fuses are made chiefly by means of polysilicon or metal connections. The dimensions of the cross-section of these connections as well as the useful melting length of the fuse are defined as a function of a nominal melting current. The principle of the melting of a fuse is simple. It is enough to make a sufficiently high current flow through the fuse to make it melt. In practice, in modern integrated circuits, this current is in the range of a few tens of milliamperes. After the fuse has melted, one of the terminals of the fuse, namely the one to which it is sought to make access impossible, is electrically unconnected. To prevent this kind of situation, this terminal of the fuse is connected to a level detector. This level detector is capable, firstly, of revealing the melting of the fuse and, secondly, of keeping the end of the unconnected connection at a constant potential.

However, there are problems related to the melting of the fuse. First of all, the melting current should be fairly high. This means that there should be a fairly large control transistor to convey this current. This control transistor can be used to facilitate the programming of the melting of several fuses of a circuit. The size of the transistor is related to the current which this transistor should let through. Furthermore, the rising edge of the current pulse should be extremely steep. For, if the rise in current is slow, make every due allowance, the fuse melts slowly. As and when it melts, its electrical resistance increases. For example, the dimensions of the section may be reduced during this melting process. Since this resistance increases, the energy that the fuse can dissipate is reduced. Since this energy is reduced, the fuse gets heated less and less, with the risk that it can no longer melt. If this phenomenon occurs, it then becomes impossible to make the fuse melt. Finally, the command of the transistor which conveys the current makes it necessary to provide for the application, in the melting procedure of a fuse, of a command to end the melting process, and this complicates this procedure. In practice, a melting period has to be planned and this melting period should be relatively big to provide for efficient melting under all circumstances.

Moreover, fuses are highly fragile with respect to electrostatic discharges. This fragility is essentially due to the presence of the big control transistor for the melting of the fuse. For, owing to its size, this transistor no longer forms an efficient shield against high voltage electrostatic discharges, even if its control input is deactivated. For, it is possible that this big transistor lets through the energy of the electrostatic discharges when the integrated circuit is handled, especially at the end of manufacture and when this integrated circuit is being installed in an electronic system. These repeated electrostatic discharges may have the same effect as an excessively slow rising edge of the melting current. At the instant when it is desired to make the fuse melt, its resistance may be great because of the initial melting that it may have undergone. The energy that it can dissipate is then excessively low: it no longer melts.

An object of the present invention is to overcome these drawbacks while, however, being, at the same time, applicable only to CMOS type integrated circuits. This restriction is not troublesome because CMOS technology is presently coming into ever-increasing use. In particular, it is often preferred to NMOS technology. CMOS technology is characterized by a semiconducting substrate of a given type (generally P type) of conductivity in which insulation pads are made by implantation of impurities corresponding to an opposite type of conductivity (generally of the N type). Various transistors and junctions can be made by implanting doped regions with one type of impurity or another either in the substrate or in these pads.

However, CMOS technology is known to suffer a conduction "flip-over" or "latch-up" phenomenon. This latch-up phenomenon corresponds to a triggering of stray thyristors which are naturally created in a CMOS circuit with pads. These stray thyristors are formed by a sequence of regions of alternate types of conductivity. A first region of a given type of conductivity (generally P) is contained in a pad of a second type of given conductivity (generally N). This pad is itself placed in a substrate of the first type of given conductivity (generally P) and has one or more regions of the second type of conductivity (generally N). The succession of these four regions of alternating conductivity forms a thyristor. In certain cases, keeping this thyristor in the off state is a difficult task.

In the invention, however, the existence of this stray thyristor is turned to advantage in order to make the fuse melt by connecting a terminal of this fuse to this thyristor and by triggering it. At the instant of melting, the current is given by a melting potential generator. The current flows through the fuse and the thyristor, which has one of its terminals connected to the other pole of the melting potential generator. By acting in this way, an immediate solution is got to the problems referred to. Firstly, the thyristor, while being smaller, accepts a higher current. Secondly, the thyristor is conductive as long as the fuse is not completely melted: namely as long as the fuse lets current through. As soon as the fuse has melted, the thyristor gets deactivated. There is no need to provide for a command to end the melting process in this procedure. Furthermore, it will be shown that when this stray thyristor is not triggered, it has a shield for the fuse, against the electrostatic discharges, which is far greater than in the prior art referred to.

An object of the invention is therefore a device for the melting of a fuse in a CMOS type integrated circuit comprising a thyristor, series mounted with the fuse, said thyristor being a stray thyristor of this integrated circuit, and means to control the turning on of this thyristor.

BRIEF DESCRIPTION OF THE DRAWINGS

The invention will be better understood from the following description and the accompanying figures. These figures are given purely by way of indication, and in no way restrict the scope of the invention. Of these figures:

FIG. 1 shows a sectional view of an integrated circuit of the CMOS type provided with a stray thyristor;

FIG. 2 show the equivalent diagram of the circuit represented by this stray thyristor;

FIG. 3 shows a first alternative embodiment of a device for triggering a stray thyristor;

FIG. 4 shows a second alternative embodiment of a triggering circuit;

FIG. 5 shows a schematic view of a level detector to check the melting state of the fuse;

FIG. 6 shows a technologicl improvement of a pullback transistor of this level detector.

DESCRIPTION OF PREFERRED EMBODIMENTS

FIG. 1 shows a stray transistor of a CMOS type integrated circuit. This integrated circuit (not shown) is integrated in a substrate 1, of the P− type herein, comprising pads, notably a pad 2, with inverted conductivity, namely N−. In a standard way, the substrate 1 has regions 3 and 4 doped with the same impurities as those used to dope the pad 2 but in a greater concentration, namely N+. They are used to peform various electronic functions, especially those of transistors. The substrate also has a substrate connector 5 consisting of a doped region with the same impurities but with a higher P+ concentration than the substrate itself. This substrate connector is used to bias the substrate at a fixed potential. When the substrate is of the P type, this fixed potential VSS is generally equal to zero volts. It may even be smaller than zero. One of the N+ doped regions in the substrate, for example, in this case, the region 3 close to the pad 2, is also biased at the potential VSS.

Similarly, the pad 2 has P+ doped regions 6 and 7, doped with impurities different from those used to dope the pad 2. It also has a region 8, doped N+ with the same impurities as for itself, used as a pad connector. In general, a pad connector is biased at a reverse potential of the substrate biasing potential. With a P type substrate and N type pads, the pad is positively biased at Vcc. One of the P+ doped regions in the pad, for example in this case the region 6 close to the region 3, is also biased at the potential Vcc. It can be determined that the highly doped regions 3 and 6 on either side of the boundary 9 of the pad in the substrate 1, in combination with the pad 2 and the substrate 1, form a stray thyristor of the P+ N− P− N+ type. Access can be had to the intermediate regions of this thyristor by the pad connector 8 and the substrate connector 5 respectively.

The equivalent diagram of this thyristor is shown in FIG. 2. In the pad, the region 6, the pad 2 and the substrate 1 form a bipolar transistor T1. In the substrate, the region 3, the substrate 1 and the pad 2 form a bipolar transistor T2. Everything happens as if the transistor T1 in the PNP type example were to be connected by its emitter to Vcc (in the region 6, FIG. 1), connected by its collector, by means of series-mounted resistors R2 and R3, to the substrate connector 5, and connected by its base, by means of a resistor R1, to the pad connector 8. The transistor T2, of the NPN type, may be considered as being connected by its emitter to the region 3, by its collector, through series-mounted resistors R1 and R4, to the region 8, and by its base, through the resistor R3, to the substrate connector 5. The bases of these transistors, the points A and B respectively, are thus connected to the mid-points of the resistor bridges, R1-R4 and R2-R3 respectively.

When idle, the thyristor is not conductive. The voltage at a point A is equal to the voltage Vcc and the voltage at the point B is equal to Vss. The two transistors T1 and T2 are off. To trigger the thyristor, it is enough to make the voltage at the point A fall until the transistor T1 starts conducting. It is enough, for example, to make this voltage drop by 0.6 volts. This drop in voltage is equal to the emitter-base voltage of the transistor T1. As soon as the transistor T1 starts conducting, the voltage at the point B rises, owing to the fact that current flows through the resistor R3. Consequently, the transistor T2, which was off, comes on. Since the transistor T2 comes on, current now flows in the resistors R1 and R4. This continues to make the voltage drop at the point A drop and results in positive reaction. The latch-up phenomenon then occurs. The two transistors go into saturation, making a very high current (a few hundreds of milliamperes) flow between the supply Vcc and the ground potential VSS. Only a cut-off or breakdown of the supply Vcc can stop this phenomenon.

The idea of the invention is to use a control means to make the potential of the point A drop or, reciprocally, to make the potential of the point B rise when the thyristor is off. The following description, which is not open to the inference of any restriction therefrom, corresponds to a first approach, namely that of making the voltage drop at the point A.

FIG. 3 shows a sectional view of a first alternative embodiment of a thyristor triggering circuit. In this figure, the fuse 10 has been shown, along with its supply, with a melting voltage VFUS which may be specific. In the invention, however, owing to the greater efficiency of the thyristor, the fuses can be made to melt with a lower voltage than Vcc. In its embodiment, the fuse melting device is of a circular type, centered on an axis 11 which is substantially vertical to the terminal 12 of the fuse closest to the thyristor. The stray triggering thyristor therefore has a central N+ doped region 8 surrounded by a P+ doped rim region 6. These regions 8 and 6 are contained in the pad 2, which is also of a circular type and is itself surrounded by a circular region 3 of the N+ type in the substrate. The region 3 is itself contained in another P+ doped circular region 5. The regions 8, 6, 3 and 5 have the same functions herein as those shown above. The regions 3 and 5 are connected by connections 13 and 14 to the biasing potential of the substrate. The two regions 6 and 8 of the pad 2 are connected in common to the terminal 12 of the fuse 6 by connections 15 to 17.

A MOS tranistor T3 for triggering the thyristor consists of a region 18 adjoining the pad 2, close to the boundary 9, of a region 19 of the substrate, facing this region 18 on the other side of the boundary 9 and of the ring-shaped N+ doped region 3. This hybrid transistor therefore consists of regions for which the concentrations in impurities are respectively N−, P− and N+. A gate 20 superimposed on top of an electrical insulation gate oxide (not shown) is supplied with a command signal COM. The gate 20 straddles the boundary 9. It effectively governs the conduction of the transistor T3 in the region 19. It has no influence on the region 18 and, therefore, it is not inconvenient to let it go beyond the top of this region 18. When a positive pulse is applied to the gate 20, current flows in the transistor T3, thus formed. This current can only come from the pad 2. Owing the internal resistance of the semiconducting material of the pad (resistor R1), the potential in this pad 2 drops. Thus, a drop in potential at the point A is caused. For the thyristor triggering phenomenon to occur, it is necessary, however, to see to it that the transistor T3 can enable a voltage drop of a minimum of 0.6 volts at the point A. For this, the resistor R1 should be relatively high and the resistance R4 should be relatively low. Furthermore, the transistor T3 should not itself be too resistive. In FIG. 1, dashes are used to show the mode of connection of the transistor T3 in the equivalent diagram of the transistor.

The alternative shown in FIG. 3 has other major advantages. In particular, it enables very efficient protection against electrostatic type discharges. Let it be considered, for example, that a device for protection against electrostatic discharges greater than 20 volts is parallel-connected on the pin 21 of the fuse. In the prior art referred to, the melting transistor of the fuse generally triggered the melting process, at one and the same voltage as the shielding device (by junction avalanche, BVdSS, etc.) or even at a lower voltage. This led to damage to the fuse and, possibly, to its untimely destruction. In a device shown, the conduction of the N−P− type junction between the pad and the substrate is typically located at 100 to 150 volts, owing to low concentrations of impurities in the neighbourhood of this junction. Thus, the fuse protecting device is always acted upon first. It plays its role normally: the fuse cannot be damaged.

In another alternative shown in FIG. 4 the thyristor triggering transistor is a standard MOS transistor. It has a region 22 close to the boundary 9 as well as the region 3 located near the region 22, with the same concentration of impurities (N+) as itself. The region 22 is separated from the region 3 by a distance corresponding to the conduction channel of this transistor. This channel is controlled by a gate 23 which receives the command signal COM. The pad 2 further has another region 24, which is an N+ doped region, playing the role of the secondary pad connector and electrically connected by a connection 25 to the region 22 of the control transistor. In this alternative embodiment, the region 22 is no longer directly connected to the potential DSS. It is connected to it only conditionally: when the signal COM is applied to the gate 23 and when it makes the transistor 3–22 conductive. Here, therefore the control transistor is a standard MOS transistor.

Before making the fuse melt, the potential available at the connection 25 is substantially the potential VFUS. When the melting command is applied to the gate 23, the transistor 22-23-3 comes on in such a way that the potential of a mid-point C of a divider bridge formed by resistors R5, R1 drops. At this instant, no current flows into the resistor R1. But, owing to the geographical position of the region 24 between the region 8 and the region 6, the drop in potential at the point C causes a drop substantially equal to the potential at the point A of the transistor T1. Under these conditions, the expected phenomenon, namely the triggering of the thyristor, takes place.

The value of this alternative embodiment lies in the making of a transistor 22-23-3 of a standard type as compared with the hybrid transistor 18-19-3 of FIG. 3. However, in this method, the protection against electrostatic charges is less well ensured. For, an electrostatic discharge may take a path that goes successively through the connection 16, the region 8, the pad 2, the region 24, the connection 25 and the region 22 before going to the ground by avalanche of the junction 22-1 and BVdss of the control transistor. Under these conditions, it is the junction 22-1 and the length of the transistor channel T3 which ensures voltage strength against this discharge. Since the region 22 is highly doped, the potential barrier of the junction is lower. We are then faced with a drawback of the same type, from this point of view as in the prior art referred to. However, an improvement of the invention also resolves this problem.

There may be numerous circuits to detect the state of the fuse. FIG. 5 shows an example of such circuits. This circuit essentially has a pull-back transistor T4 and a detection inverter comprising two transistors 26, 27. The transistors, 26 and 27 are series-connected between the supply Vcc of the integrated circuit and the ground. When the detection inverter detects the change in state of the fuse, it flips over. The output 28 of the level detector is connected to the mid-point of the two transistors 26 and 27. These two transistors are controlled in common, through a resistor R6, by a potential available at the terminals of a transistor T4. The transistor T4 is parallel-connected to the terminals of the transistor T3. It receives the potential Vcc at its gate. When the fuse has melted, when the command COM has stopped, the transistor T4 causes the grounding of the input of the transistors 26 and 27. The transistor 27 is then off, while the transistor 26 is on. The output 28 is carried to the potential Vcc. The presence of the resistor R6 is used to protect the fuse 10 from the electrostatic discharges which might flow through the transistors 26 or 27. During a discharge of this type, a great difference in potential arises in the resistor R6 in such a way that the potential barrier of the transistor 27 is sufficient to withstand residues of this electrostatic discharge. By contrast, this can be contemplated neither with the transistor T4 which is almost always conductive nor with the transistor T3 of the alternative embodiment of FIG. 4.

However, to achieve this aim, these two transistors can be made in the manner shown in FIG. 6. Preferably, the transistors T3 and T4 comprise a gate 29 which governs a conduction channel between two N+ doped regions 30 and 31. One of their regions, the region 31, which is the region closest, geographically, to the thyristor in the substrate 1, is implanted in an N− doped pad 32. Owing to the low concentration of impurities in the pad 32, the N− P− junction between this pad and the substrate withstands the electrostatic discharges. A difference in potential of 150 volts, for example, may be maintained (in practice, however, it may be limited by the breakdown of the gate oxide between the region 32 and the gate 29, towards 50 volts). The length of the channel, however, should be enough to prevent the transistor T4 from going prematurely into breakdown mode).

What is claimed is:

1. A device for the melting of a fuse in a CMOS type integrated circuit comprising a thyristor, series-mounted with the fuse, and means to control the turning on of this thyristor, wherein the thyristor comprises a semiconductor substrate with a first type of conductivity, said substrate being the substrate of the integrated circuit, a circular semiconducting pad of a second type of conductivity made in this substrate, a first region in the middle of the pad doped with impurities corresponding to the second type of conductivity and surrounded by a second circular region doped with impurities corresponding to the first type of conductivity, and on the inside rim of the pad, said circular pad being surrounded by a third circular region outside and in the neighborhood of the pad doped with impurities corresponding to the second type of conductivity, itself surrounded by a fourth circular region doped with impurities corresponding to the first type of impurities, the first and second doped region both being connected to a terminal of the fuse, the third and fourth doped region both being connected to a biasing potential of the substrate, the control means comprising a MOS type transistor formed by the alignment of a pad region, a substrate region and a third doped region outside the pad, a control gate of which being superimposed on a zone geographically in between the pad region and the third doped region outside the pad.

2. A device according to claim 1, wherein the thyristor is a stray type thyristor of this integrated circuit.

3. A device according to either claim 1 or claim 2, comprising a circuit to enforce the potential of one terminal of the fuse after the melting of this fuse, this circuit being provided with a pull-back transistor, said pull-back transistor comprising two regions of a first type conductivity, made in a semiconductor material of opposite type conductivity, and only one of said regions being made in a vaster field of the same type conductivity, but with a lower concentration of impurities.

* * * * *